United States Patent [19]
Wu et al.

[11] Patent Number: 6,116,427
[45] Date of Patent: Sep. 12, 2000

[54] TRAY FOR BALL GRID ARRAY DEVICES

[75] Inventors: Chung-Ju Wu, Kaohsiung; Wei-Feng Lin; Chen-Wen Tsai, both of Hsin-Chu, all of Taiwan

[73] Assignee: Silicon Integrated Systems Corp., Hsin-Chu, Taiwan

[21] Appl. No.: 09/494,891

[22] Filed: Jan. 31, 2000

[51] Int. Cl.[7] .................................................. B65D 73/02
[52] U.S. Cl. .......................................... 206/706; 206/722
[58] Field of Search .................................... 206/701, 706, 206/712, 722, 725, 557, 564, 562

[56] References Cited

U.S. PATENT DOCUMENTS 5,547,082  8/1996  Roger et al. ......................... 206/722 X
5,597,074  1/1997  Ko ....................................... 206/722 X Primary Examiner—Jacob K. Ackun
Attorney, Agent, or Firm—Ladas & Parry

[57] ABSTRACT

A tray is adapted to receive a plurality of ball grid array devices therein, and includes a base plate having a device-receiving portion and a peripheral portion around the device-receiving portion. The device-receiving portion has a top side formed with a device-receiving recess. The top side of the device-receiving portion is further formed with a partition unit in the device-receiving recess for dividing the device-receiving recess into a plurality of cavities adapted for receiving the ball grid array devices respectively therein. The device-receiving portion further has a bottom side formed with a plurality of openings. Each of the openings is aligned with a corresponding one of the cavities and is adapted to receive an array of ball contacts formed on a bottom side of the ball grid array device that is disposed in the corresponding one of the cavities therein. The openings are grouped into a set of first openings remote from the peripheral portion and a set of second openings surrounding the first openings and adjacent to the peripheral portion. Guard strips are formed on the bottom side of the device-receiving portion and are disposed solely and respectively in the second openings.

7 Claims, 4 Drawing Sheets

TRAY FOR BALL GRID ARRAY DEVICES

BACKGROUND OF THE INVENTION

1. Field of the Invention

The invention relates to a tray for ball grid array (BGA) devices, more particularly to a stackable tray for BGA devices.

2. Description of the Related Art

BGA devices are integrated circuit devices having a bottom surface formed with an array of ball contacts for mounting directly on a circuit board using conventional surface mounting techniques or indirectly with the use of a suitable integrated circuit socket on the circuit board.

Prior to mounting on a circuit board, BGA devices are generally placed in a tray. A conventional tray 1 for BGA devices 2 is shown in FIG. 1. As illustrated, the tray 1 is formed with a plurality of cavities 10 to receive the BGA devices 2 therein. Each of the cavities 10 has a bottom part formed with an opening 11 to receive the array of ball contacts 20 on the respective BGA device 2 therein. Inside the opening 11 of each cavity 10, a guard unit (not shown) is formed to prevent the fingers of an operator who is handling the tray 1 from scratching and damaging the ball contacts 20 of the BGA devices 2 inside the cavities 10 that are adjacent to a peripheral portion of the tray 1. However, the presence of the guard unit in the opening 11 of each cavity 10 arises in the following drawbacks:

Identification marks of a BGA device 2 are usually printed on a top side of the latter. BGA devices 2 of the same type are placed on the same tray 1 to facilitate use of the same. During the production of electronic equipment, trays 1 that respectively contain different BGA devices 2 may be stacked one on top of the other to facilitate transfer of the BGA devices 2 from one location to another. The guard units in the openings 11 in an upper tray 1 of the stack hinder visibility of the identification marks on the BGA devices 2 on a lower tray 1 of the stack, thereby resulting in the need to remove the upper tray 1 to identify the BGA devices 2 on the lower tray 1.

SUMMARY OF THE INVENTION

Therefore, the main object of the present invention is to provide a tray of the type having guard units inside cavity-aligned openings that are adjacent to a peripheral portion of the tray to protect ball contacts on BGA devices from being scratched and damaged when handling the tray, the tray being stackable on a similar lower tray and permitting identification of BGA devices on the lower tray without removing the upper tray from the lower tray.

Another object of the present invention is to provide a tray of the aforesaid type that can facilitate removal of BGA devices therefrom.

According to the present invention, a tray is adapted to receive a plurality of ball grid array devices therein, and comprises a base plate having a device-receiving portion and a peripheral portion around the device-receiving portion. The device-receiving portion has a top side formed with a device-receiving recess. The top side of the device-receiving portion is further formed with partition means in the device-receiving recess for dividing the device-receiving recess into a plurality of cavities adapted for receiving the ball grid array devices respectively therein. The device-receiving portion further has a bottom side formed with a plurality of openings. Each of the openings is aligned with a corresponding one of the cavities and is adapted to receive an array of ball contacts formed on a bottom side of the ball grid array device that is disposed in the corresponding one of the cavities therein. The openings are grouped into a set of first openings remote from the peripheral portion and a set of second openings surrounding the first openings and adjacent to the peripheral portion. A plurality of guard strips are formed on the bottom side of the device-receiving portion and are disposed solely and respectively in the set of second openings to protect the ball contacts on the ball grid array devices received in the cavities that are adjacent to the peripheral portion.

The peripheral portion has a bottom side formed with a peripheral groove therealong. The peripheral portion further has an upwardly extending surrounding wall that cooperates with the top side of the device-receiving portion to form a buffer space. The top end of the surrounding wall of a lower tray is capable of abutting against the bottom side of the peripheral portion of an upper tray at the peripheral groove such that the bottom side of the device-receiving portion of the upper tray extends into the buffer space in the lower tray and such that the bottom side of the device-receiving portion of the upper tray is spaced apart from the top side of the device-receiving portion of the lower tray.

When two trays of this invention are stacked one on top of the other, because the first openings are not provided with the guard strips, removal of the BGA devices from the cavities, which are aligned with the first openings, in the upper tray will permit viewing of the BGA devices on the lower tray without the need for removing the upper tray from the lower tray.

Preferably, the partition means is formed with a plurality of finger notches to facilitate removal of the ball grid array devices from the cavities.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
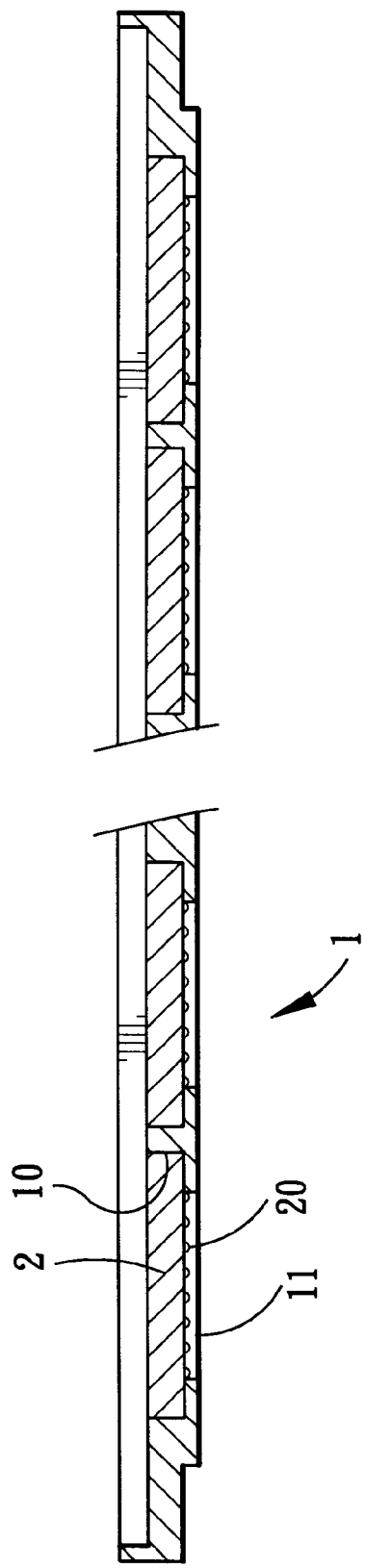
FIG. 1 is a sectional view illustrating a conventional tray for BGA devices.
Figure 2:
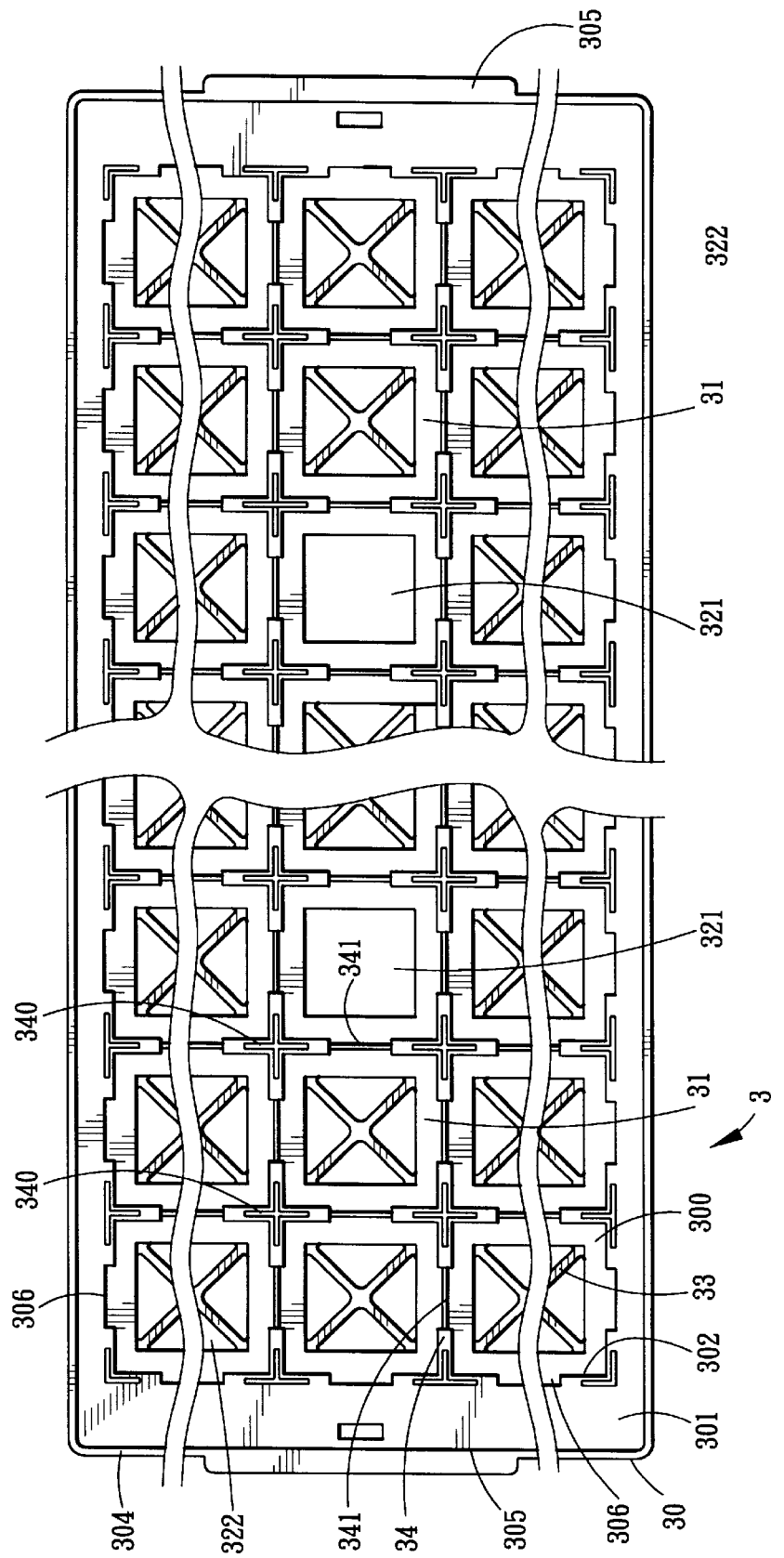
FIG. 2 is a schematic top view of the preferred embodiment of a tray for BGA devices according to the present invention.
Figure 3:
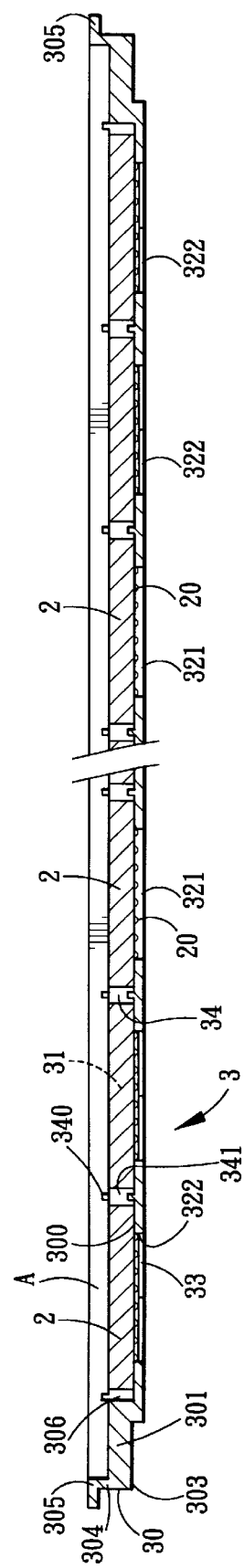
FIG. 3 is a sectional view of the preferred embodiment.
Figure 4:
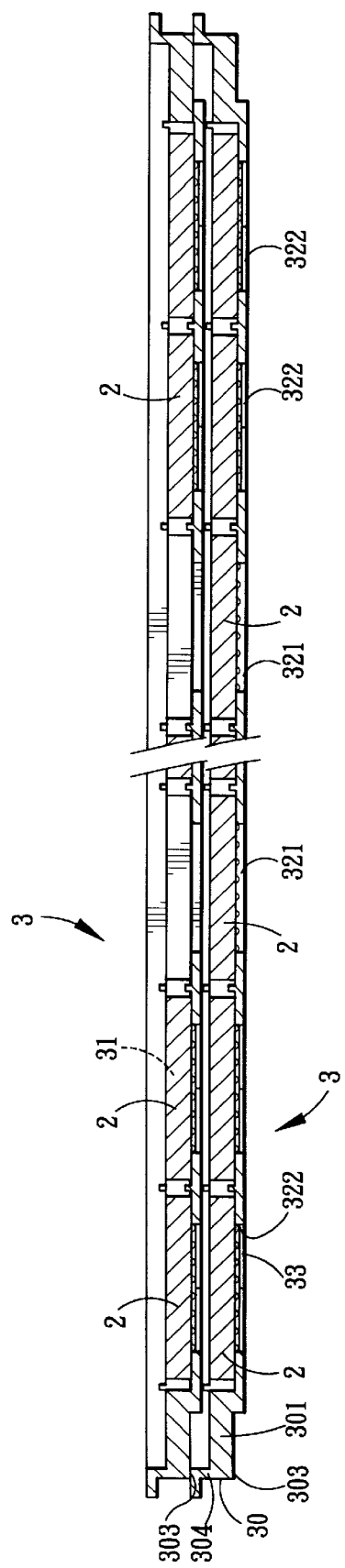
FIG. 4 is a sectional view illustrating how two trays of the preferred embodiment are stacked one on top of the other.

Referring to FIGS. 2, 3 and 4, the preferred embodiment of a tray 3 according to the present invention is shown to be adapted to hold a plurality of BGA devices 2 therein. Each BGA device 2 has a bottom side formed with a plurality of ball contacts 20.

The tray 3 includes a base plate 30 having a device-receiving portion 300 and a peripheral portion 301 around the device-receiving portion 300. The device-receiving portion 300 has a top side formed with a rectangular device-receiving recess 302. The top side of the device-receiving portion 30 is further formed with a partition unit 34 in the device-receiving recess 302 for dividing the device-receiving recess 302 into a plurality of cavities 31 adapted for receiving the BGA devices 2 respectively therein. The device-receiving portion 300 further has a bottom side formed with a plurality of openings 321, 322. Each of the openings 321, 322 is aligned with a corresponding one of the cavities 31 and is adapted to receive the array of ball contacts 20 on the BGA device 2 that is disposed in the corresponding one of the cavities 32 therein. The openings 321, 322 are grouped into a set of first openings 321 remote from the peripheral portion 301 and a set of second openings 322 surrounding the first openings 321 and adjacent to the peripheral portion 301. In the preferred embodiment, there are two first openings 321 that are disposed on a longitudinal axis of the device-receiving recess 302. Cross-shaped guard strips 33 are formed on the bottom side of the device-receiving portion 300 and are disposed solely and respectively in the set of second openings 322 to protect the ball contacts 20 on the BGA devices 2 received in the cavities 32 that are adjacent to the peripheral portion 301 from being scratched and damaged during handling of the tray 3.

The peripheral portion 301 has a bottom side formed with a peripheral groove 303 therealong. The peripheral portion 301 further has an upwardly extending surrounding wall 304 that cooperates with the top side of the device-receiving portion 300 to form a buffer space (A), and that has a top end formed with an oppositely disposed pair of lateral flanges 305 extending away from each other to further facilitate handling of the tray 3.

As best shown in FIG. 4, when two trays 3 are stacked one on top of the other, the top end of the surrounding wall 304 of the lower tray 3 abuts against the bottom side of the peripheral portion 301 of the upper tray 3 at the peripheral groove 303 such that the bottom side of the device-receiving portion 300 of the upper tray 3 extends into the buffer space (A) (see FIG. 3) in the lower tray 3 and such that the bottom side of the device-receiving portion 300 of the upper tray 3 is spaced apart from the top side of the device-receiving portion 300 of the lower tray 3.

Because the first openings 321 are not provided with the guard strips 33, removal of the BGA devices 2 from the cavities 31, which are aligned with the first openings 321, in the upper tray 3 will permit viewing of the identification marks on the top side of the BGA devices 2 on the lower tray 3 without the need for removing the upper tray 3 from the lower tray 3.

In the preferred embodiment, the partition unit 34 is formed with a plurality of upwardly projecting spacers 340. The spacers 340 on the lower tray 3 contact the bottom side of the device-receiving portion 300 of the upper tray 3 to ensure spacing between the bottom side of the device-receiving portion 300 of the upper tray 3 and the top side of the device-receiving portion 300 of the lower tray 3.

In the present invention, to facilitate removal of the BGA devices 2 from the cavities 31, the partition unit 34 is formed with a plurality of first finger notches 341 that inter-communicate adjacent ones of the cavities 31, and the peripheral portion 301 is further formed with a plurality of second finger notches 306 respectively communicated with the cavities 31 that are immediately adjacent thereto. The finger notches 341, 306 permit extension of a finger of the operator therein for lifting the BGA devices 2 away from the cavities 2.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A tray adapted to receive a plurality of ball grid array devices therein, each of the ball grid array devices having a bottom side formed with an array of ball contacts, said tray comprising:

a base plate having a device-receiving portion and a peripheral portion around said device-receiving portion, said device-receiving portion having a top side formed with a device-receiving recess, said top side of said device-receiving portion being further formed with partition means in said device-receiving recess for dividing said device-receiving recess into a plurality of cavities adapted for receiving the ball grid array devices respectively therein, said device-receiving portion further having a bottom side formed with a plurality of openings, each of said openings being aligned with a corresponding one of said cavities and being adapted to receive the array of ball contacts on the ball grid array device that is disposed in the corresponding one of said cavities therein, said openings being grouped into a set of first openings remote from said peripheral portion and a set of second openings surrounding said first openings and adjacent to said peripheral portion, a plurality of guard strips being formed on said bottom side of said device-receiving portion and being disposed solely and respectively in said set of second openings to protect the ball contacts on the ball grid array devices received in said cavities that are adjacent to said peripheral portion, said peripheral portion having a bottom side formed with a peripheral groove therealong, said peripheral portion further having an upwardly extending surrounding wall that cooperates with said top side of said device-receiving portion to form a buffer space, said top end of said surrounding wall of a lower tray being capable of abutting against said bottom side of said peripheral portion of an upper tray at said peripheral groove such that said bottom side of said device-receiving portion of the upper tray extends into said buffer space in the lower tray and such that said bottom side of said device-receiving portion of the upper tray is spaced apart from said top side of said device-receiving portion of the lower tray.

2. The tray of claim 1, wherein said partition means is formed with a plurality of upwardly projecting spacers, said spacers on the lower tray contacting said bottom side of said device-receiving portion of the upper tray to ensure spacing between said bottom side of said device-receiving portion of the upper tray and said top side of said device-receiving portion of the lower tray.

3. The tray of claim 1, wherein said device-receiving recess is rectangular and has a longitudinal axis, and said set of first openings is disposed on the longitudinal axis.

4. The tray of claim 1, wherein said partition means is formed with a plurality of first finger notches to facilitate removal of the ball grid array devices from said cavities.

5. The tray of claim 4, wherein said first finger notches inter-communicate adjacent ones of said cavities.

6. The tray of claim 5, wherein said peripheral portion is further formed with a plurality of second finger notches respectively communicated with said cavities that are immediately adjacent thereto to facilitate removal of the ball grid array devices from said cavities.

7. The tray of claim 1, wherein said surrounding wall has a top end formed with an oppositely disposed pair of lateral flanges that extend away from each other.

* * * * *